(12) United States Patent
Oh et al.

(10) Patent No.: US 9,379,064 B2
(45) Date of Patent: Jun. 28, 2016

(54) SEMICONDUCTOR DEVICE AND METHOD OF MOUNTING SEMICONDUCTOR DIE TO HEAT SPREADER ON TEMPORARY CARRIER AND FORMING POLYMER LAYER AND CONDUCTIVE LAYER OVER THE DIE

(71) Applicant: STATS ChipPAC, Ltd., Singapore (SG)

(72) Inventors: JiHoon Oh, Kyoungki-do (KR); SinJae Lee, Kyoungki-do (KR); JinGwan Kim, Seoul (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 14/697,950

(22) Filed: Apr. 28, 2015

(65) Prior Publication Data
US 2015/0228590 A1    Aug. 13, 2015

Related U.S. Application Data

(63) Continuation of application No. 13/190,339, filed on Jul. 25, 2011, now Pat. No. 9,048,209, which is a continuation of application No. 12/541,334, filed on Aug. 14, 2009, now Pat. No. 8,003,496.

(51) Int. Cl.
*H01L 21/301* (2006.01)
*H01L 21/46* (2006.01)
(Continued)

(52) U.S. Cl.
CPC .............. *H01L 23/552* (2013.01); *H01L 21/52* (2013.01); *H01L 21/561* (2013.01); *H01L 21/565* (2013.01); *H01L 21/76877* (2013.01); *H01L 21/76895* (2013.01); *H01L 23/3128* (2013.01); *H01L 23/36* (2013.01); *H01L 23/3675* (2013.01); *H01L 23/528* (2013.01); *H01L 23/5226* (2013.01); *H01L 23/5389* (2013.01); *H01L 24/24* (2013.01); *H01L 24/82* (2013.01); *H01L 23/49816* (2013.01); *H01L 24/48* (2013.01); *H01L 2224/04105* (2013.01);
(Continued)

(58) Field of Classification Search
CPC ... H01L 23/36; H01L 21/52; H01L 21/76895; H01L 23/3678; H01L 23/552
USPC ............................ 438/122, 434; 257/702, 707
See application file for complete search history.

(56) References Cited

U.S. PATENT DOCUMENTS 5,250,843 A    10/1993   Eichelberger
5,353,498 A    10/1994   Fillion et al.
(Continued)

*Primary Examiner* — David S Blum
(74) *Attorney, Agent, or Firm* — Robert D. Atkins; Patent Law Group: Atkins and Associates, P.C.

(57) ABSTRACT

A semiconductor device is made by forming a heat spreader over a carrier. A semiconductor die is mounted over the heat spreader with a first surface oriented toward the heat spreader. A first insulating layer is formed over the semiconductor die and heat spreader. A via is formed in the first insulating layer. A first conductive layer is formed over the first insulating layer and connected to the heat spreader through the via and to contact pads on the semiconductor die. The heat spreader extends from the first surface of the semiconductor die to the via. A second insulating layer is formed over the first conductive layer. A second conductive layer is electrically connected to the first conductive layer. The carrier is removed. The heat spreader dissipates heat from the semiconductor die and provides shielding from inter-device interference. The heat spreader is grounded through the first conductive layer.

25 Claims, 7 Drawing Sheets

(51) Int. Cl.

| | | |
|---|---|---|
| *H01L 21/78* | (2006.01) | |
| *H01L 21/14* | (2006.01) | |
| *H01L 23/10* | (2006.01) | |
| *H01L 23/34* | (2006.01) | |
| *H01L 23/552* | (2006.01) | |
| *H01L 21/56* | (2006.01) | |
| *H01L 23/31* | (2006.01) | |
| *H01L 23/36* | (2006.01) | |
| *H01L 23/538* | (2006.01) | |
| *H01L 21/52* | (2006.01) | |
| *H01L 21/768* | (2006.01) | |
| *H01L 23/367* | (2006.01) | |
| *H01L 23/522* | (2006.01) | |
| *H01L 23/528* | (2006.01) | |
| *H01L 23/498* | (2006.01) | |
| *H01L 23/00* | (2006.01) | |

(52) U.S. Cl.
CPC ....... *H01L2224/20* (2013.01); *H01L 2224/211* (2013.01); *H01L 2224/24246* (2013.01); *H01L 2224/32245* (2013.01); *H01L 2224/48091* (2013.01); *H01L 2224/73265* (2013.01); *H01L 2224/73267* (2013.01); *H01L 2224/83005* (2013.01); *H01L 2224/92244* (2013.01); *H01L 2924/01004* (2013.01); *H01L 2924/014* (2013.01); *H01L 2924/01006* (2013.01); *H01L 2924/01013* (2013.01); *H01L 2924/01029* (2013.01); *H01L 2924/01047* (2013.01); *H01L 2924/01075* (2013.01); *H01L 2924/01078* (2013.01); *H01L 2924/01079* (2013.01); *H01L 2924/01082* (2013.01); *H01L 2924/01322* (2013.01); *H01L 2924/09701* (2013.01); *H01L 2924/12041* (2013.01); *H01L 2924/12042* (2013.01); *H01L 2924/12044* (2013.01); *H01L 2924/1306* (2013.01); *H01L 2924/13091* (2013.01); *H01L 2924/14* (2013.01); *H01L 2924/1433* (2013.01); *H01L 2924/15311* (2013.01); *H01L 2924/181* (2013.01); *H01L 2924/19041* (2013.01); *H01L 2924/3025* (2013.01); *H01L 2924/30105* (2013.01)

(56) References Cited

U.S. PATENT DOCUMENTS

| | | |
|---|---|---|
| 5,841,193 A | 11/1998 | Eichelberger |
| 6,246,111 B1 | 6/2001 | Huang et al. |
| 6,528,882 B2 | 3/2003 | Ding et al. |
| 6,534,859 B1 | 3/2003 | Shim et al. |
| 6,709,897 B2 | 3/2004 | Cheng et al. |
| 6,724,071 B2 | 4/2004 | Combs |
| 6,841,413 B2 | 1/2005 | Liu et al. |
| 6,891,273 B2 | 5/2005 | Pu et al. |
| 7,315,078 B2 | 1/2008 | Huang |
| 7,315,085 B2 | 1/2008 | Liu |
| 7,511,359 B2 | 3/2009 | Tang et al. |
| 7,547,966 B2 | 6/2009 | Funakoshi et al. |
| 7,619,901 B2 | 11/2009 | Eichelberger et al. |
| 7,645,638 B2 | 1/2010 | Kim et al. |
| 7,683,268 B2 | 3/2010 | Usui et al. |
| 8,003,496 B2 | 8/2011 | Oh et al. |
| 8,030,138 B1 | 10/2011 | How et al. |
| 8,610,262 B1 | 12/2013 | McLellan et al. |
| 2002/0070443 A1 | 6/2002 | Mu et al. |
| 2002/0180035 A1 | 12/2002 | Huang et al. |
| 2006/0001152 A1 | 1/2006 | Hu |
| 2006/0237827 A1 | 10/2006 | Wu et al. |
| 2007/0178622 A1 | 8/2007 | Liu et al. |
| 2008/0105967 A1 | 5/2008 | Yang et al. |
| 2008/0111233 A1 | 5/2008 | Pendse |
| 2008/0303136 A1 | 12/2008 | Mori et al. |
| 2009/0230535 A1 | 9/2009 | Otremba et al. |
| 2009/0261468 A1 | 10/2009 | Kroeninger et al. |
| 2009/0269885 A1 | 10/2009 | Madrid et al. |
| 2010/0044855 A1 | 2/2010 | Eichelberger et al. |
| 2010/0078783 A1 | 4/2010 | Otremba |
| 2010/0090322 A1 | 4/2010 | Hedler et al. |
| 2010/0148325 A1 | 6/2010 | Gruenhagen et al. |
| 2010/0224970 A1 | 9/2010 | Powell et al. |
| 2011/0018114 A1 | 1/2011 | Pagaila et al. |

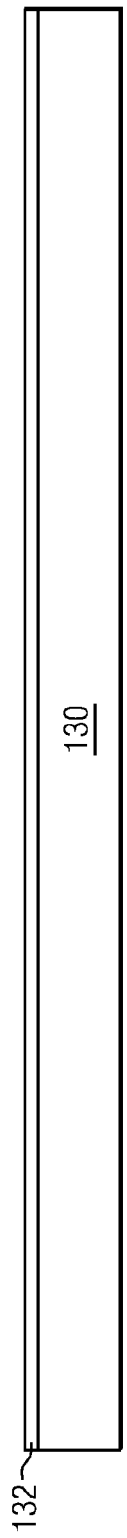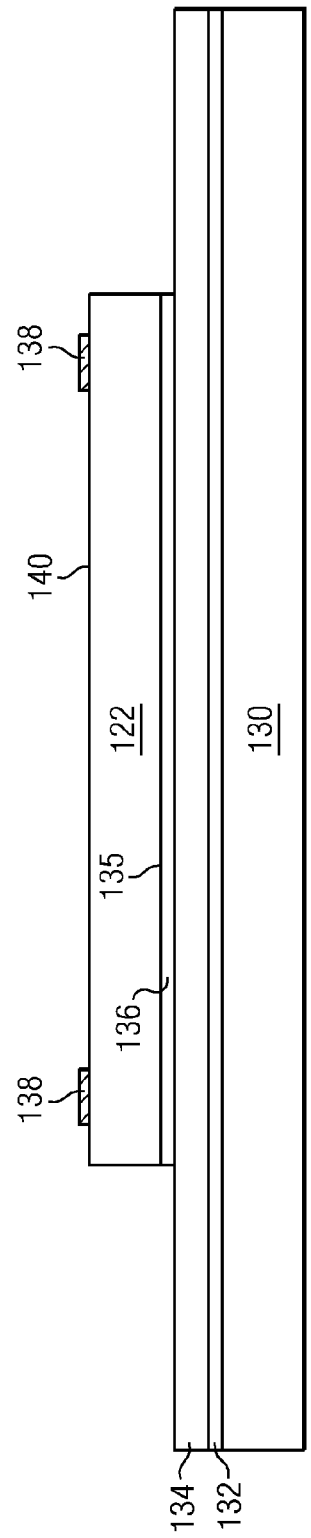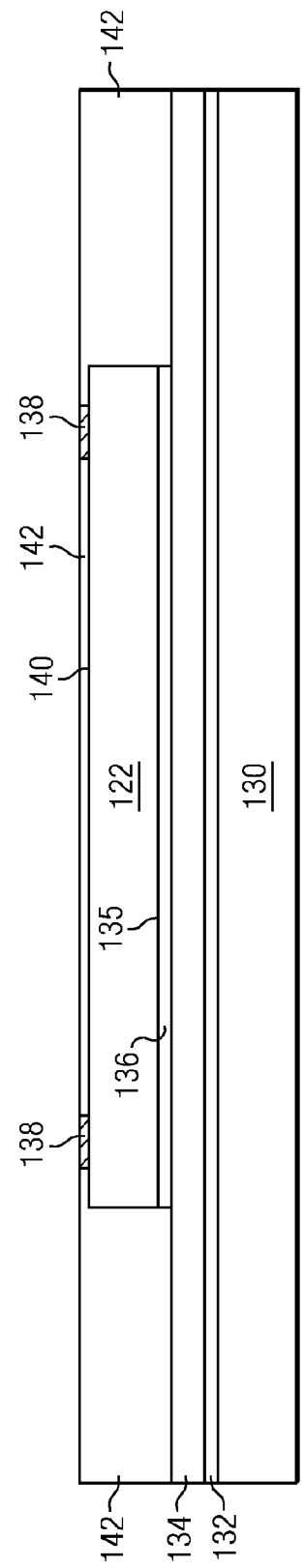

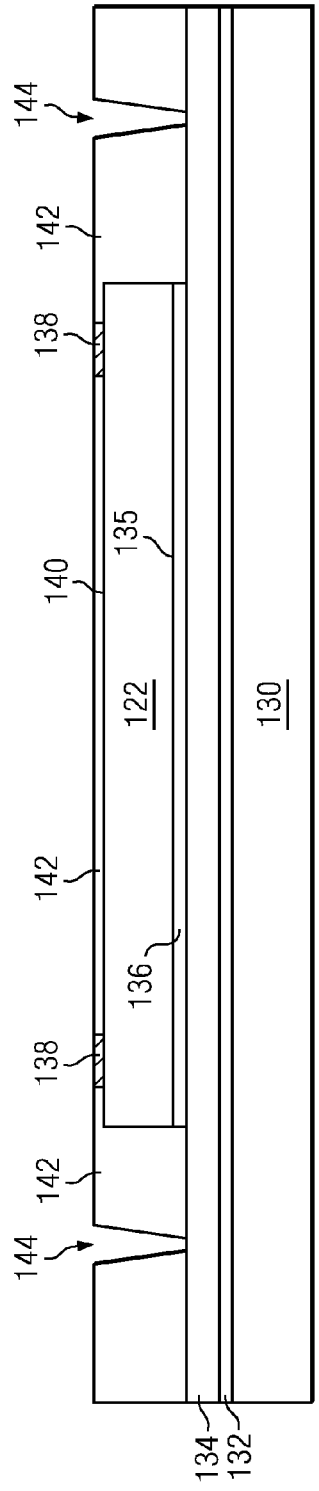
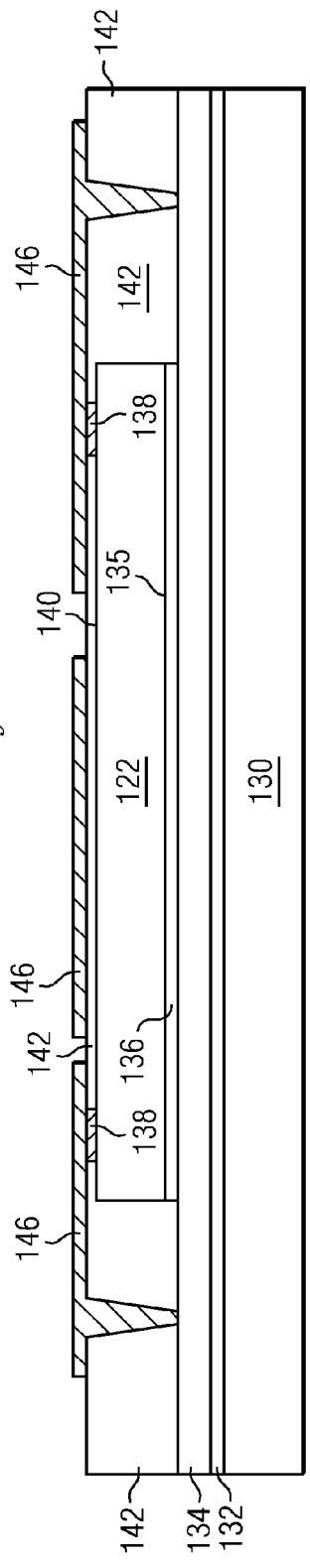
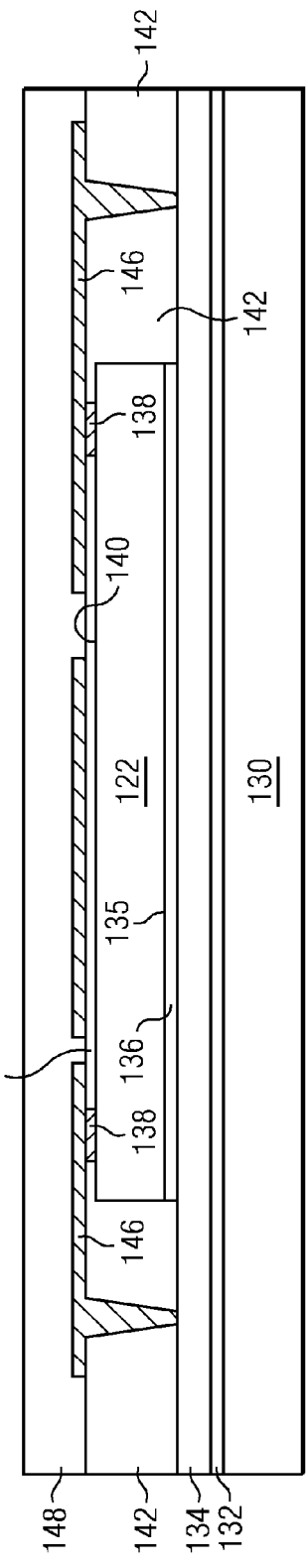

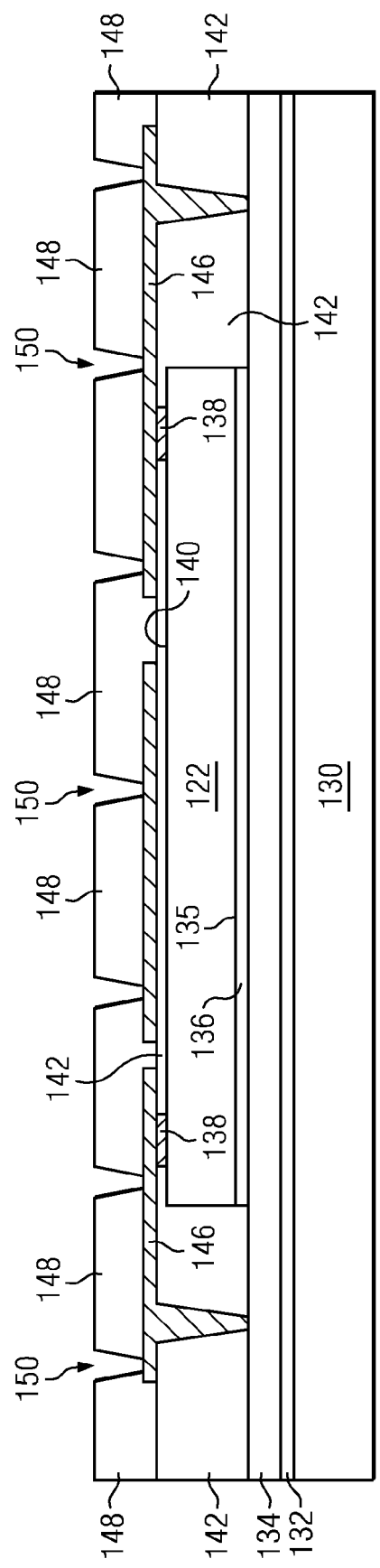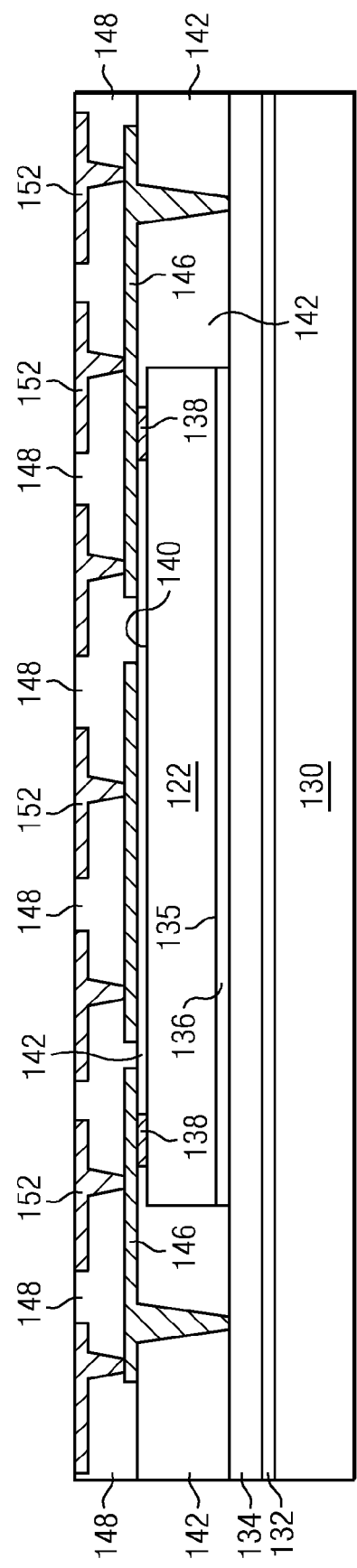

SEMICONDUCTOR DEVICE AND METHOD OF MOUNTING SEMICONDUCTOR DIE TO HEAT SPREADER ON TEMPORARY CARRIER AND FORMING POLYMER LAYER AND CONDUCTIVE LAYER OVER THE DIE

CLAIM OF DOMESTIC PRIORITY

The present application is a continuation of U.S. patent application Ser. No. 13/190,339, now U.S. Pat. No. 9,048,209, filed Jul. 25, 2011, which is a continuation of U.S. patent application Ser. No. 12/541,334, now U.S. Pat. No. 8,003,496, filed Aug. 14, 2009, which applications are incorporated herein by reference.

FIELD OF THE INVENTION

The present invention relates in general to semiconductor devices and, more particularly, to a semiconductor device and method of mounting a semiconductor die to a heat spreader on a temporary carrier and forming polymer layers and conductive layers over the die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In fan-out wafer level chip scale packages (FO-WLCSP), semiconductor die are stacked and vertically interconnected within the package. In high frequency applications, the semiconductor die emit or are susceptible to radiation, electromagnetic interference (EMI), radio frequency interference (RFI), harmonic effects, and other inter-device interference, which reduces the electrical performance of the device. In addition, the high frequency semiconductor die generate considerable thermal energy which must be adequately dissipated.

SUMMARY OF THE INVENTION

A need exists to dissipate thermal energy and shield against inter-device interference in a FO-WLCSP. Accordingly, in one embodiment, the present invention is a method of making a semiconductor device comprising the steps of providing a shielding layer, disposing a semiconductor die over the shielding layer, forming a first insulating layer over the shielding layer, forming a via through a surface of the first insulating layer and extending through the first insulating layer to the shielding layer, and forming a first conductive layer over the surface of the first insulating layer and into the via to the shielding layer.

In another embodiment, the present invention is a method of making a semiconductor device comprising the steps of providing a shielding layer, disposing a semiconductor die over the shielding layer, forming a first insulating layer over the shielding layer, and forming a conductive via through the first insulating layer and extending to the shielding layer.

In another embodiment, the present invention is a semiconductor device comprising a shielding layer and semiconductor die disposed over the shielding layer. A first insulating layer is formed over the shielding layer. A first conductive layer is formed over a surface of the first insulating layer and extending through the first insulating layer to the shielding layer.

In another embodiment, the present invention is a semiconductor device comprising a shielding layer and semiconductor die disposed over the shielding layer. A first insulating layer is formed over the shielding layer. A conductive via is formed through the first insulating layer and extending to the shielding layer.

BRIEF DESCRIPTION OF THE DRAWINGS

FIGS. 3a-3k illustrate a process of mounting semiconductor die to a heat spreader on a temporary carrier and forming polymer layers and conductive layers over the die.

DETAILED DESCRIPTION OF THE DRAWINGS

Figure 1:
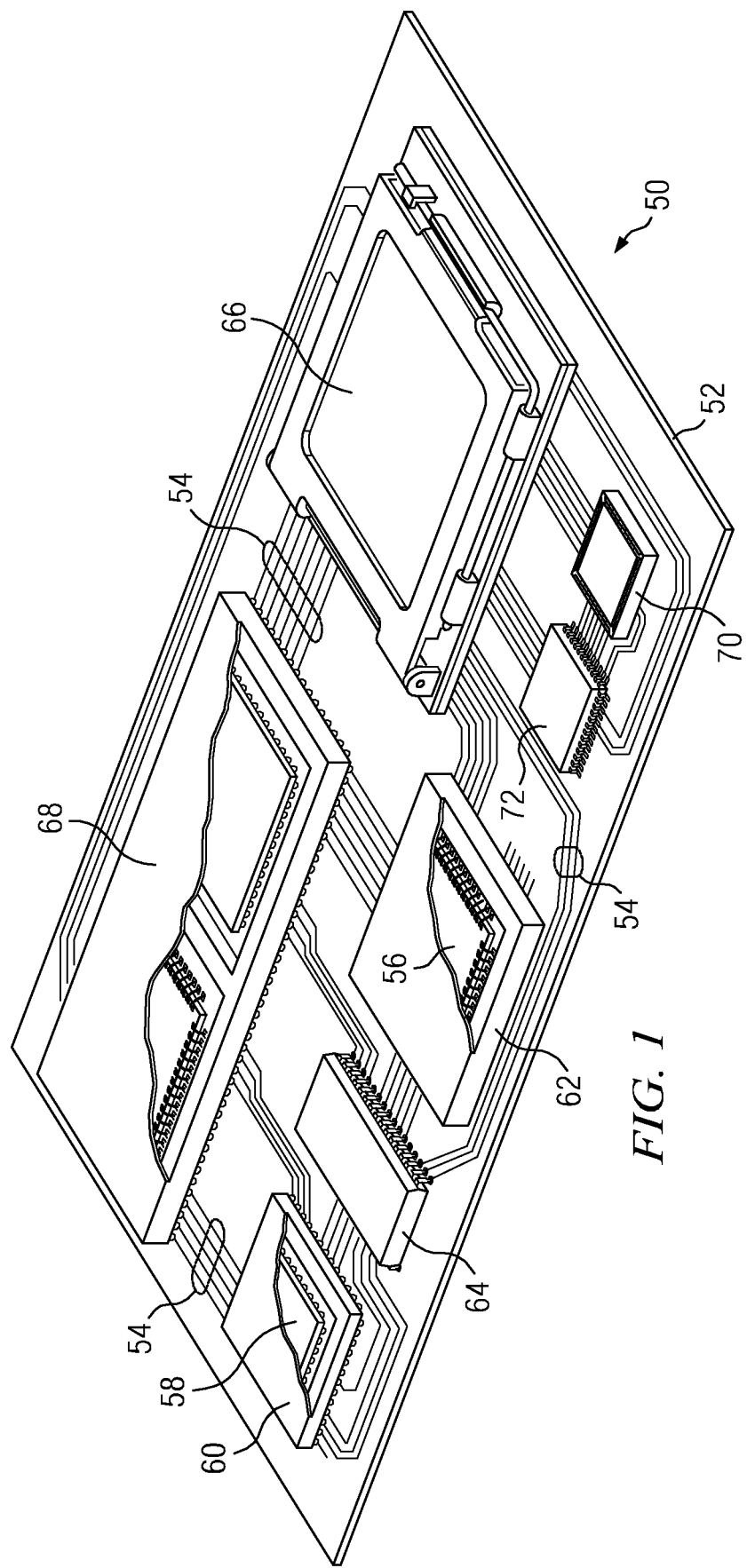
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
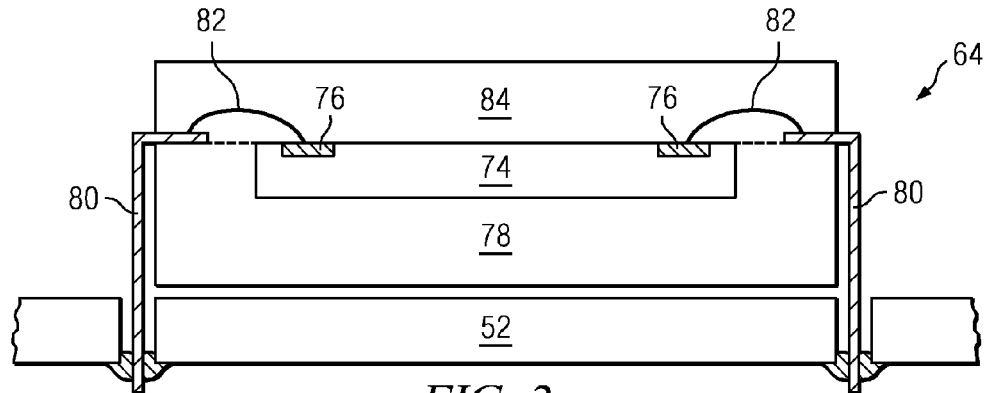
FIGS. 2a-2c illustrate further detail of the representative semiconductor packages mounted to the PCB.
Figure 2B:
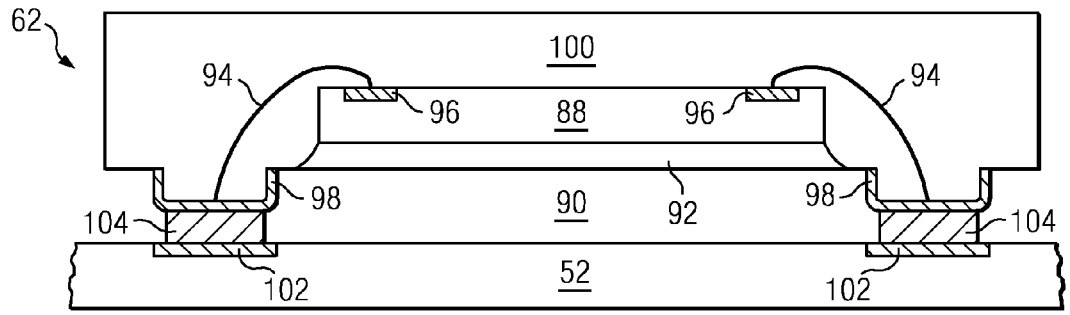
Figure 2C:
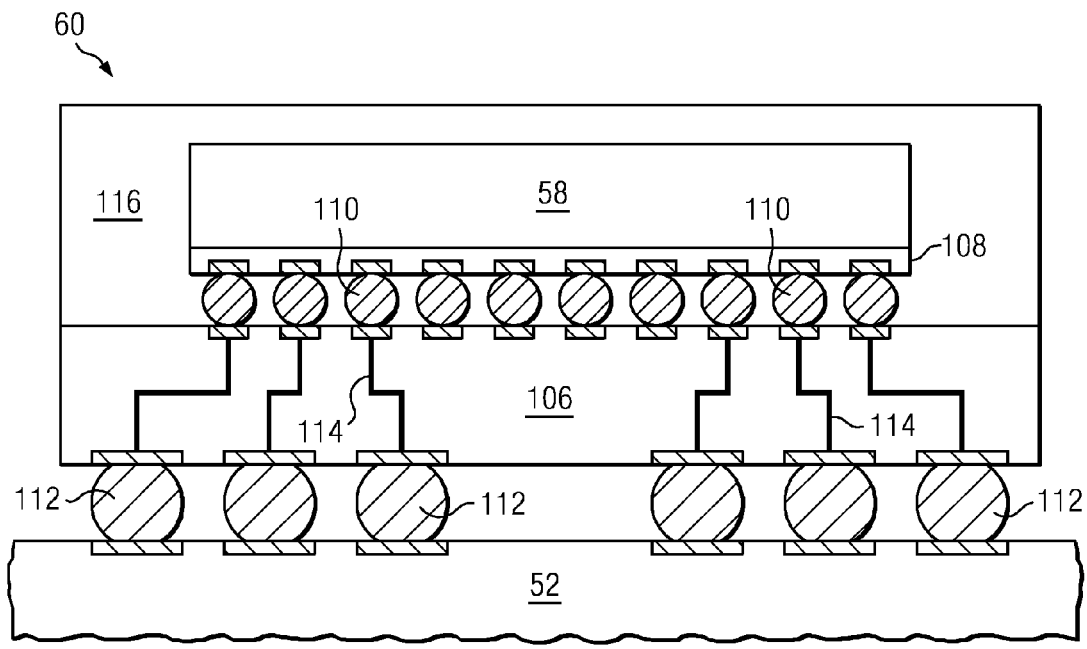

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
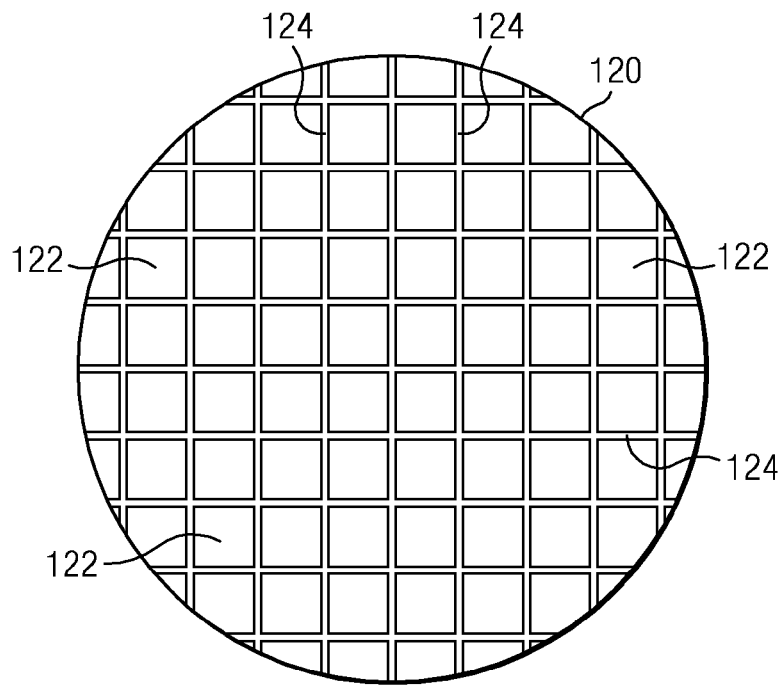

FIGS. 3a-3k illustrate, in relation to FIGS. 1 and 2a-2c, a process of mounting semiconductor die to a heat spreader on a temporary carrier and forming polymer layers and conductive layers over the die. In FIG. 3a, semiconductor wafer 120 contains a plurality of semiconductor die 122 separated by saw street 124. Each semiconductor die 122 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within the active surface of the die to implement analog circuits or digital circuits, such as digital signal processor (DSP), ASIC, memory, or other signal processing circuit. Semiconductor die 122 may also contain IPD, such as inductors, capacitors, and resistors, for RF signal processing. A typical RF system requires multiple IPDs in one or more semiconductor packages to perform the necessary electrical functions.

Figure 3B:
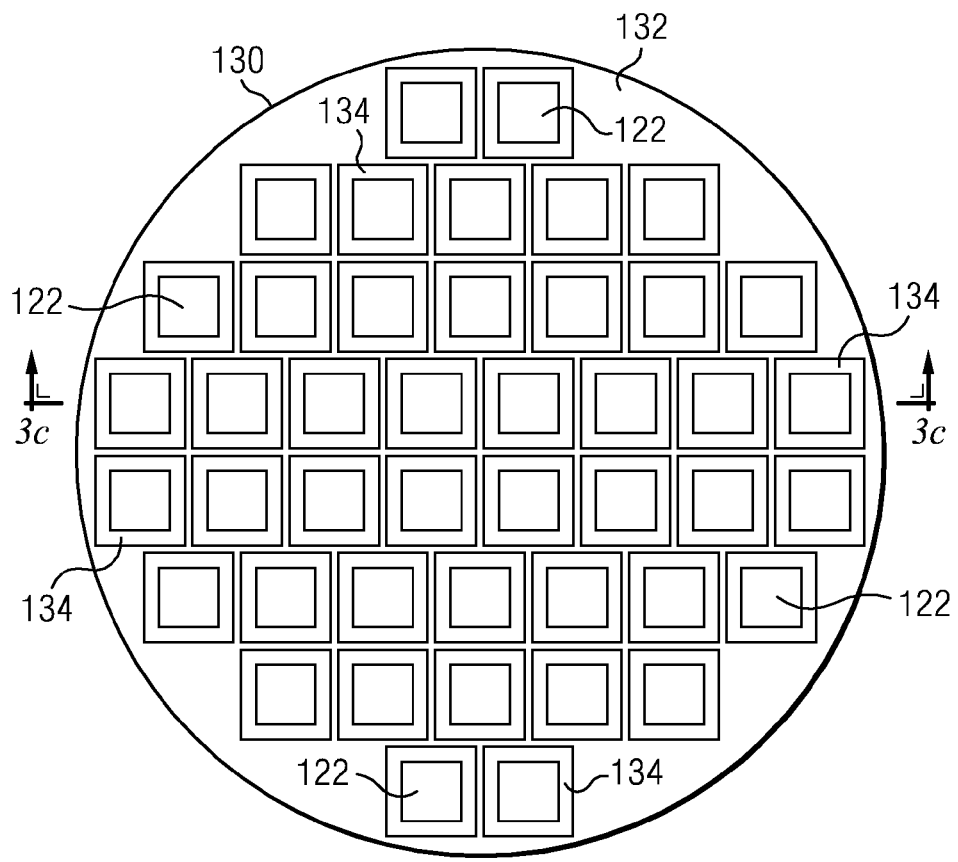

In FIG. 3b, a wafer-form substrate or carrier 130 contains temporary or sacrificial base material such as silicon, polymer, polymer composite, metal, ceramic, glass, glass epoxy, beryllium oxide, or other suitable low-cost, rigid material or bulk semiconductor material for structural support. In one embodiment, carrier 130 is 20.3 centimeters (cm) in diameter. Adhesive tape 132 is formed on carrier 130, as shown in FIG. 3c. An array of conductive heat spreaders 134 is disposed on adhesive tape 132, as shown in FIGS. 3b and 3d. Heat spreaders 134 can be Al, Cu, or another material with high thermal conductivity to provide heat dissipation. Semiconductor die 122 are singulated from wafer 120 and picked and placed onto heat spreader 134 with back surface 135 of the die oriented toward heat spreader 134 and contact pads 138 and active surface 140 of the die oriented away from carrier 130. An optional die attach adhesive or thermal interface layer (TIM) 136 holds semiconductor die 122 in place during the re-array of the die onto heat spreaders 134.

In FIG. 3e, an insulating layer 142 is formed over semiconductor die 122 and heat spreader 134. The insulating layer 142 can be one or more layers of polyimide, BCB, PBO, polynorbornene, epoxy resin with filler, epoxy acrylate with filler, or other polymer material. The insulating layer 142 is formed using printing, spin coating, or spray coating. The insulating layer 142 eliminates the need for a molding process. The insulating layer 142 is planarized to expose contact pads 138. In FIG. 3f, a plurality of vias 144 are drilled or etched into insulating layer 142. Vias 144 extend down to heat spreader 134.

In FIG. 3g, an electrically conductive layer 146 is formed over insulating layer 142 and into vias 144 using a patterning and metal deposition process such as PVD, CVD, sputtering, electrolytic plating, or electroless plating process. Conductive layer 146 can be one or more layers of Al, Cu, Sn, Ni, Au, Ag, or other suitable electrically conductive material. One portion of conductive layer 146 is electrically connected to contact pads 138 of semiconductor die 122; another portion of conductive layer 146 is thermally connected to heat spreader 134. Other portions of conductive layer 146 can be electrically common or electrically isolated depending on the design and function of the semiconductor device.

In FIG. 3h, an insulating layer 148 is formed over insulating layer 142 and conductive layer 146. The insulating layer 148 can be one or more layers of polyimide, BCB, PBO, polynorbornene, epoxy resin with filler, epoxy acrylate with filler, or other polymer material. The insulating layer 148 is formed using printing, spin coating, or spray coating. In FIG. 3i, a portion of insulating layer 148 is removed by drilling or etch development process to form vias 150 down to conductive layer 146.

In FIG. 3j, an electrically conductive layer 152 is formed over insulating layer 148 and into vias 150 using a patterning and metal deposition process such as PVD, CVD, sputtering, electrolytic plating, or electroless plating process. Conductive layer 152 can be one or more layers of Al, Cu, Sn, Ni, Au, Ag, or other suitable electrically conductive material. One portion of conductive layer 152 is electrically connected to conductive layer 146. Other portions of conductive layer 152 can be electrically common or electrically isolated depending on the design and function of the semiconductor device. Conductive layers 146 and 152 use redistribution to transfer signals from a peripheral layout to an area array.

Figure 3K:
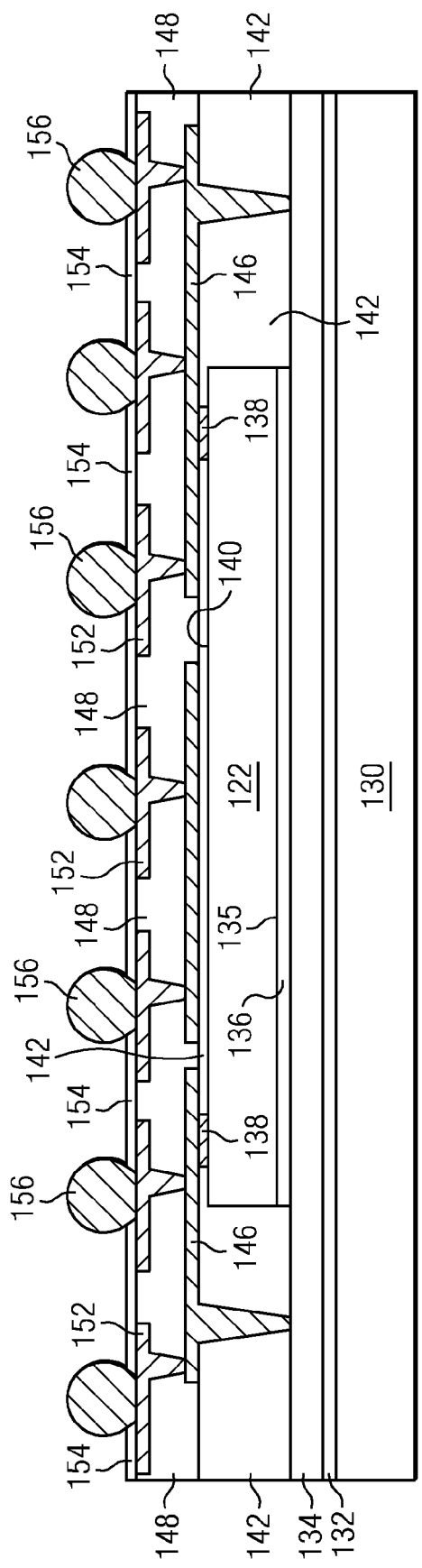

In FIG. 3k, a solder masking layer 154 is formed over conductive layer 152 and insulating layer 148 with openings to expose conductive layer 152 for next level interconnect.

An electrically conductive bump material is deposited over conductive layer 152 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 152 using a suitable attachment or bonding process. In one embodiment, the bump material is reflowed by heating the material above its melting point to form spherical balls or bumps 156. In some applications, bumps 156 are reflowed a second time to improve electrical contact to conductive layer 152. The bumps can also be compression bonded to conductive layer 152. Bumps 156 represent one type of interconnect structure that can be formed over conductive layer 152. The interconnect structure can also use bond wires, stud bump, micro bump, or other electrical interconnect.

Carrier 130 and adhesive tape 132 are removed by mechanical peel-off, CMP, mechanical grinding, thermal bake, laser scanning, or wet stripping. Semiconductor die 122 are singulated into individual units using a saw blade or laser cutting tool.

Figure 4:
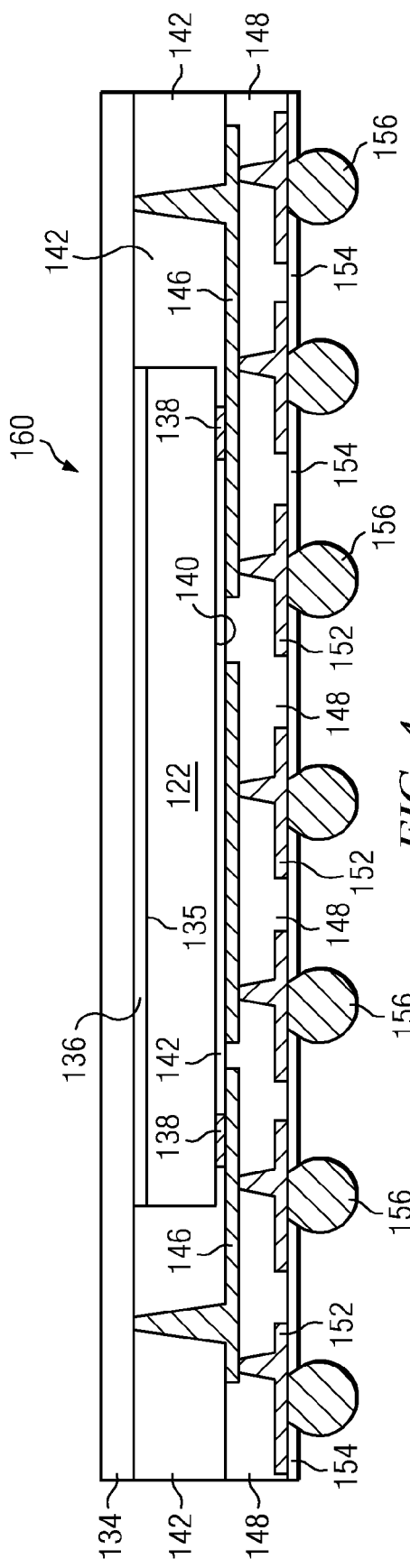
FIG. 4 illustrates the semiconductor die mounted to the heat spreader with polymer layers and conductive layers formed over and around the die.

FIG. 4 shows WLCSP 160 with back surface 135 of semiconductor die 122 directly mounted to heat spreader 134. Heat spreader 134 dissipates heat generated by semiconductor die 122. Heat spreader 134 also blocks or absorbs electromagnetic interference (EMI), radio frequency interference (RFI), and other inter-device interference. Heat spreader 134 is grounded through conductive layers 146 and 152 to bumps 156. Polymer layers 142 and 148, as formed around and over semiconductor die 122, eliminate the need for a molding process. Conductive layers 146 and 152 provide a short signal path from contact pads 138 to bumps 156 for a higher operating speed and good electrical performance for semiconductor die 122.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a shielding layer;
   forming an interface layer over the shielding layer;
   disposing a semiconductor die over the interface layer;
   forming a first insulating layer over the shielding layer;
   forming a via through a surface of the first insulating layer and extending through the first insulating layer to the shielding layer; and
   forming a first conductive layer over the surface of the first insulating layer and into the via to the shielding layer.

2. The method of claim 1, further including forming a second insulating layer over the first insulating layer and semiconductor die.

3. The method of claim 2, further including forming a second conductive layer over the second insulating layer.

4. The method of claim 3, further including forming an interconnect structure over the second conductive layer.

5. The method of claim 1, wherein the shielding layer provides shielding with respect to electromagnetic interference (EMI).

6. The method of claim 1, further including:
   providing a carrier; and
   disposing the shielding layer between the semiconductor die and carrier.

7. A method of making a semiconductor device, comprising:
   providing a shielding layer;
   disposing a semiconductor die over the shielding layer with a non-active surface of the semiconductor die oriented toward the shielding layer;
   forming a first insulating layer over the shielding layer; and
   forming a conductive via through the first insulating layer and extending to the shielding layer.

8. The method of claim 7, further including forming a second insulating layer over the first insulating layer and semiconductor die.

9. The method of claim 8, further including forming a conductive layer over the second insulating layer.

10. The method of claim 9, further including forming an interconnect structure over the conductive layer.

11. The method of claim 7, further including disposing an interface layer between the semiconductor die and shielding layer.

12. The method of claim 7, further including:
    providing a carrier; and
    disposing the shielding layer between the semiconductor die and carrier.

13. The method of claim 7, wherein the shielding layer extends continuously across the semiconductor die.

14. A semiconductor device, comprising:
    a shielding layer;

a semiconductor die disposed over the shielding layer with a non-active surface of the semiconductor die oriented toward the shielding layer;

a first insulating layer formed over the shielding layer; and a first conductive layer formed over a surface of the first insulating layer and extending through the first insulating layer to the shielding layer.

15. The semiconductor device of claim 14, further including a second insulating layer formed over the first insulating layer and semiconductor die.

16. The semiconductor device of claim 15, further including a second conductive layer formed over the second insulating layer.

17. The semiconductor device of claim 16, further including an interconnect structure formed over the second conductive layer.

18. The semiconductor device of claim 14, further including an interface layer disposed between the semiconductor die and shielding layer.

19. The semiconductor device of claim 14, wherein the shielding layer extends continuously across the semiconductor die.

20. A semiconductor device, comprising:
a shielding layer;
an interface layer formed over the shielding layer;
a semiconductor die disposed over the interface layer;
a first insulating layer formed over the shielding layer; and
a conductive via formed through the first insulating layer and extending to the shielding layer.

21. The semiconductor device of claim 20, further including a second insulating layer formed over the first insulating layer and semiconductor die.

22. The semiconductor device of claim 21, further including a conductive layer over the second insulating layer.

23. The semiconductor device of claim 22, further including an interconnect structure formed over the conductive layer.

24. The semiconductor device of claim 20, wherein the shielding layer provides shielding with respect to electromagnetic interference (EMI).

25. The semiconductor device of claim 20, wherein the shielding layer extends continuously across the semiconductor die.

* * * * *